INVENTOR
RICHARD F. RUTZ

BY John E. Dougherty, Jr.

ATTORNEY

United States Patent Office 3,445,686

Patented May 20, 1969

3,445,686

SOLID STATE TRANSFORMER

Richard F. Rutz, Cold Spring, N.Y., assignor to International Business Machines Corporation, Armonk, N.Y., a corporation of New York Filed Jan. 13, 1967, Ser. No. 609,135
Int. Cl. H03k 23/08
U.S. Cl. 307—299 18 Claims

ABSTRACT OF THE DISCLOSURE

The transformer is formed of a recombination radiation input junction and a plurality of individual output junctions which are arranged to intercept the radiation produced at the input junction and produce a photocurrent and/or photovoltage in response to this radiation. The individual output junctions are not biased and are connected in a series circuit so that the voltages produced at the junctions are additive and thus a voltage output greater than the voltage input is achieved. Both the input and the output junctions are formed of the same semiconductor material (GaAs) and the entire device may be integrated in a single crystalline body. The input junction and output junctions are electrically isolated from each other by an intrinsic semi-insulating region of the material. The output voltage varies with the impedance connected across the output. Voltage transformation can be achieved directly for both A.C. and D.C. inputs. A constant current output for a wide range of impedances to be driven by the transformer is achieved by designing the output junctions so that one of these junctions has a lower saturation current than the others. Step down voltage transformation is achieved by applying the input to the series connected junctions and taking the output from the single junction.

*Description of the prior art*

The most pertinent prior art is listed below.

(a) Copending application Ser. No. 239,434, now U.S. Patent No. 3,369,133, filed Nov. 23, 1962, on behalf of R. F. Rutz.

(b) Patent No. 3,229,104, issued to R. F. Rutz on Jan. 11, 1966.

(c) Patent No. 3,043,959, issued to G. Diemer on July 10, 1962.

(d) Patent No. 3,061,739, issued to H. G. Stone et al. on Oct. 30, 1962.

The above references are exemplary of the art as it relates to both devices which employ optical coupling between inputs and outputs and solid state transformers. References (a), (b) and (c) relate to devices which employ an electro-optic input and an opto-electrical output. Though in Patent No. 3,229,104 a structure is shown which includes a plurality of separate input junctions and a plurality of separate output junctions in a single semiconductor body, this structure is not a transformer but rather forms a plurality of optically coupled transistors in which amplification and power gain is achieved. By transformer action it is meant that the input voltage is transformed to a different output voltage without the necessity of applying any bias to the output circuit. The Stone patent referred to above is the only one which discusses transformer action in a solid state device. Stone employs a field effect transistor which is not similar to the transformer of the subject invention in either structure or performance.

*Summary of the invention*

One of the problems which arises in semiconductor circuit applications is that of transforming voltages from one level to another level cheaply and efficiently. Magnetic transformers are, of course, well known in the art and this type of transformer requires an A.C. input in order to produce voltage transformation. It is common in many applications, in which the voltage which is to be transformed is D.C., to first convert that voltage to A.C., to transform the A.C. voltage, and finally to rectify the transformed voltage to again realize a D.C. voltage. In accordance with the principles of the present invention a solid state transformer is provided which is cheap and inexpensive to fabricate, which can be readily integrated with other semiconductor devices, which can be extremely small in size, and which is at the same time capable of transforming both A.C. and D.C. voltages. These advantages are realized in accordance with the principles of the invention, as illustrated by the embodiments disclosed herein, by employing optical coupling between a recombination radiation junction to which the input is applied and a plurality of individual light responsive output junctions which are connected in a series and across which the transformed output voltage is realized. By reversing the connections, the device can be operated to step down the input voltage and step up the input current.

It is, therefore, an object of the present invention to provide an improved solid state transformer.

It is a further object to provide a solid state voltage transformer which is economical to fabricate, and which can be very easily combined, both from the standpoint of electrical connections and physical integration, with active semiconductor circuits.

It is a further object to realize a solid state transformer which can directly transform D.C. voltages.

It is still another object to provide a solid state transformer which is capable of providing a transformer voltage output and which can be employed as a constant current supply for a relatively large range of impedances.

The foregoing and other objects, features and advantages of the invention will be apparent from the following more particular description of preferred embodiments of the invention, as illustrated in the accompanying drawings.

Figures 1, 2:
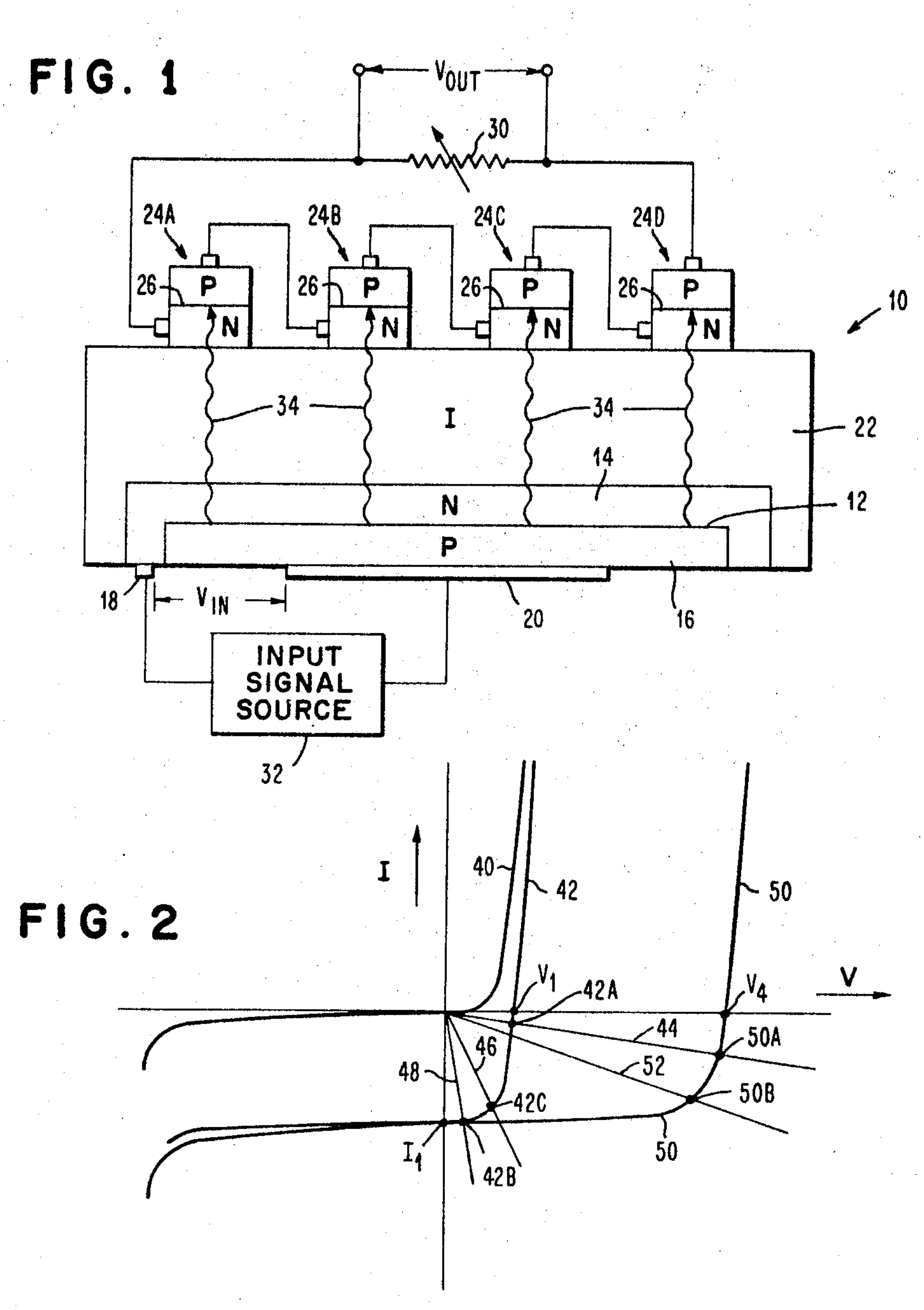
FIG. 1 is a somewhat schematic representation of one embodiment of a solid state transformer built in accordance with the present invention.
FIG. 2 is a plot depicting the voltage-current characteristics of the output junctions of the device of FIG. 1 in the presence of a light input applied to these junctions.

In the embodiment of the inventive structure shown in FIG. 1, the entire device is formed of a single crystal of GaAs 10. The input for the transformer is applied across a p-n junction 12 formed between an n-region 14 and a p-region 16. Typically the p-region 16 dopant is zinc and the n-region dopant is tellurium. The junction is a diffused junction though other junctions prepared by other fabrication processes may be employed. The input voltage is applied across a pair of electrodes 18 and 20 which make ohmic contact to the n- and p-regions 14 and 16, respectively.

The transformer of FIG. 1 has four individual output diodes 24A–24D, each of which is electrically insulated from the input p-n junction 12 by a region of insulating material 22 which is intrinsic or semiinsulating and has relatively high insulating properties. Each of these output diodes includes a junction 26 between a p-region and an n-region which may be fabricated using the same dopants as used at the input junction 12.

The output diodes are connected in series with the p-region of each diode being connected directly to the n-region of an adjacent diode and the electrical output of the transformer is developed across this series circuit at a load resistor 30 which is connected between the n-region of diode 24A and the p-region of diode 24D. This load 30 represents the input impedance of the circuit being driven by the transformer. The input signal for the transformer is supplied by source 32 which is connected across input junction 12 and applies a forward bias voltage across this junction. Junction 12 is an efficient recombination radiation junction, by which it is meant that when a forward bias is applied to this junction to produce carrier injection a high percentage of the carriers injected undergo radiative transitions to produce recombination radiation. The energy of this radiation, and, therefore, its frequency, is dependent upon the energy levels between which the recombination radiation transitions occur. In a GaAs junction prepared as described above, the radiative energy is slightly smaller than the band gap energy, which at room temperature is about 1.35 electron volts.

The recombination radiation energy produced at junction 12 is represented by arrows 34 and this radiation propagates through the insulating region 22 without appreciable losses and falls upon the junction 26 in each of the output diodes 24A through 24D. The junctions of these diodes are responsive to the recombination radiation to produce both a photo current and a photo voltage. The photo responsive characteristics of these diodes are illustrated in FIG. 2. In this individual figure, the V–I characteristic for each of these diodes in the absence of applied recombination radiation is illustrated by a curve 40. This curve is the normal curve for a p-n junction with the forward bias characteristic being plotted in the first quadrant and the reverse bias characteristic in the third quadrant. When recombination radiation of an energy which can be absorbed at one of these junctions is applied to the junction, the characteristic is depicted by a curve 42. As is shown in the figure this curve intercepts the abscissa at a point $V_1$ which indicates that a photo voltage of this magnitude is developed across the photo responsive diode in response to the recombination radiation even in the absence of a photo current. Curve 42 intercepts the ordinate axis at point $I_1$ indicating that a photo current is produced in response to the recombination radiation even in the absence of a photo voltage. Point $V_1$, of course, is illustrative of the condition when an infinite impedance is connected across the diode, point $I_1$ indicates the operating characteristic for an individual diode when the impedance across the diode is zero.

The actual current and voltage for any one of the individual diodes 24A through 24D, when recombination radiation is applied, is determined by the impedance characteristic of the load connected across that device. This is illustrated by three load lines designated 44, 46 and 48 which represent different impedances connected across an individual diode of the type shown in FIG. 1. When the load impedance is at a very high value, as indicated by load line 44, the operating condition is at 42A and a voltage extremely close to the maximum value $V_1$ is produced with very little current flow. When a very low impedance such as that represented by load line 48 is connected across an individual diode, the operating point is at 42B in which case a smaller voltage is produced but a larger current. When an impedance such as that represented by load line 46 is connected across an individual diode, the operating point is at 42C in which case relatively high voltage and high current are produced at the same time across the diode. When operating at the latter point 42C it is apparent that both the voltage and current produced at the diode can vary sharply with changes in impedance, however, high power outputs are achieved when operating in this region. When operating at a point such as point 42A, the output voltage remains essentially constant over a wide range of impedances, but the output current varies rather sharply with changes in impedance. When operating at or near point 42B the output current remains essentially constant when the impedance is changed whereas the output voltage varies sharply with changes in impedance.

In FIG. 2, curve 42 represents the characteristic for each of the individual diodes 24A through 24D when one such diode is exposed to recombination radiation and an impedance is connected across the junction 26 of that diode. In the embodiment of FIG. 1 the four diodes 24A through 24D are as shown connected in series so that the voltage produced across the diodes is additive and it is this combined voltage which appears across the output impedance 30. The current through the series circuit is, of course, the same and is limited by the saturation current which can flow through any one of the individual diodes when a particular light input is applied. The composite characteristics of these diodes is depicted in FIG. 2 by curve 50.

This curve intercepts the abscissa at point $V_4$ indicating that the open circuit voltage is essentially four times that for an individual diode. However, as is indicated by the fact that this curve also intercepts the ordinate axis at point $I_1$, the short circuit maximum current which can be produced by the input light is essentially the same. It is interesting to note that the combined characteristic of the four diodes, represented by curve 50, shows a lower photosaturation current in the third quadrant of the figure than the saturation current represented by curve 42 which is the curve for an individual diode. This is one indication of the fact that when the diodes are connected together, as shown, each diode in effect becomes a load on the other diodes in the series circuit, and, at the same time, each diode as it generates a voltage and current applies its output to the other diodes in the series circuit.

However, the curve 50 represents the characteristics of the four diodes connected in a series circuit and takes into account the interaction of the diodes one with another when input radiation is applied to the diodes. When the load 30 connected across the diodes has an impedance represented by the load line 44, the actual operating point is at 50A in which case a high voltage output is realized. Load lines 48 and 46 intercept curve 50 at points along the essentially flat portion of this curve at which a lower voltage output is realized and a higher current. Load line 52 is drawn to indicate the operating point at 50B which is the region in which high current and high voltage outputs are simultaneously produced.

By comparing the slope of load line 52 with that of load line 46 and the intercepts of these load lines with curve 42, which represents the characteristic for an individual diode, and curve 50, which represents the characteristic for the four diodes connected in series, it can be seen that the effect of the external impedance varies in accordance with the numbers of diodes which are connected in the output series circuit. It is also apparent that large voltage transformations are realized with a high impedance output. As the impedance of output is lowered the ratio of the output voltage to the input voltage is also decreased. A further advantageous feature of the device is illustrated by the essentially flat portion of the curve 50 extending between point $I_1$ and point 50B. An essentially constant current output is provided in this range.

It should be emphasized at this point that in the structure of FIG. 1 each of the output diodes is unbiased. It is not necessary to apply any biasing energy of any type to these output diodes. The structure of FIG. 1 is a true transformer in that it is not necessary to apply any energy to the output circuit; the input voltage is transformed directly by the solid state device. Because of the additive effect of the photo voltages generated at each of the series connected diodes, the voltage at the output is greater than that applied at the input. The voltage transformation can be increased by employing larger numbers of series connected diodes in the output circuit.

It should be also emphasized that this voltage transformation can be realized for both an A.C. input and a D.C. input. A D.C. voltage can be directly transformed by the solid state transformer without the necessity of first converting that voltage into an A.C. voltage. When straight A.C. transformation is desired, the input junction is biased to an essentially linear portion of the input characteristic for the junction, and the A.C. input signal is applied in addition to the bias. In such a case, the A.C. output realized varies about a bias value produced as the result of the D.C. input bias applied to the input junction.

Figure 3:
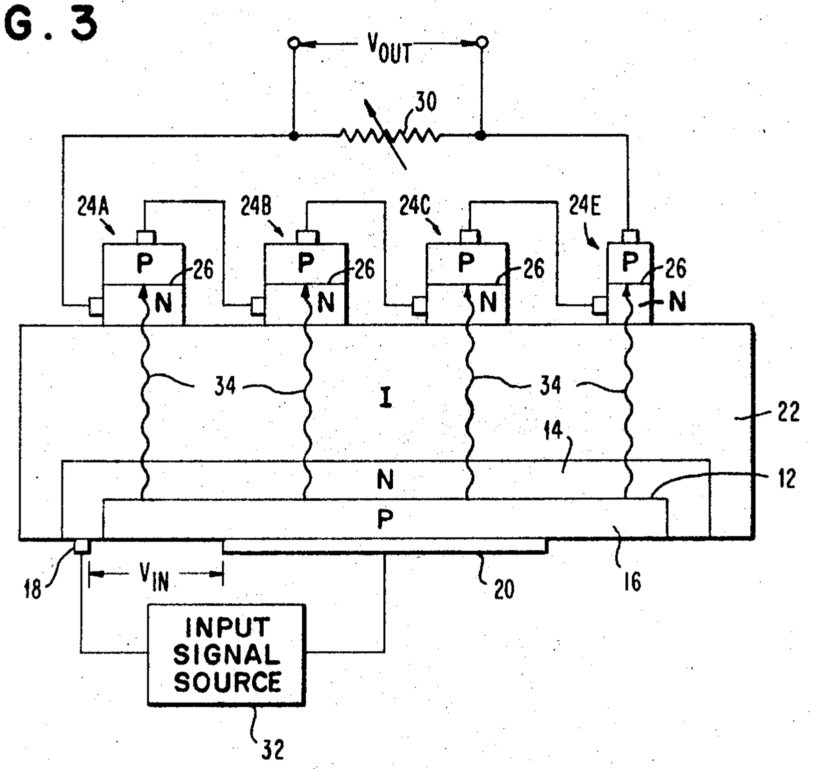
FIG. 3 is a somewhat schematic representation of another embodiment of a solid state transformer built in accordance with the present invention.
Figure 4:
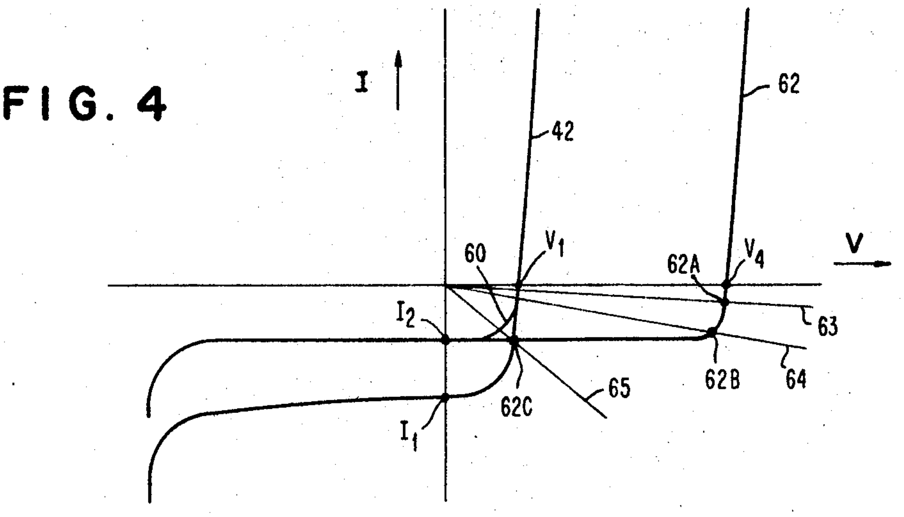
FIG. 4 is a plot depicting the voltage-current characteristics of the output junctions of the device of FIG. 3 in the presence of a light input applied to these junctions.

The embodiment of FIG. 3 is essentially the same as FIG. 1 but one of the diodes of FIG. 3 designated 24E has smaller junction areas than that of the three diodes 24A to 24C. In FIG. 4 the photoresponsive V–I characteristics of the diodes 24A through 24C are plotted in the form of a curve again designated 42 since this characteristic is the same as that shown in FIG. 2. Again it should be reiterated that this curve represents the characteristic for one of the diodes, when considered alone, and also only the characteristic for a given amount of recombination radiation applied to that diode. A further curve designated 60 in FIG. 4 represents the characteristic of the diode 24E having the small area junction for the same radiation producing input voltage across input junction 12. Since the photovoltage realized at any one of these diodes is determined mainly by the energy levels at the output junction, the intercept for curve 60 with the abscissa is very close to that of curve 42. However, due to the fact that the area of the junction of diode 24E is smaller, this diode has a lower photo saturation current and intersects the ordinate axis at a point $I_2$ which, as shown, represents current of about one-half of that for the other diodes represented at point $I_1$.

Because of this lower value of saturation current of diode 24E, the composite characteristic for the four output diodes of FIG. 3, which are connected in a series circuit is as represented by curve 62. The intercept with the abscissa at $V_4$ is the total voltage across the four diodes and is essentially the same signal of that as in FIG. 2. However, because of the saturation characteristic of the smaller junction area diode 24E, the current allowable in the series circuit is limited to a much lower value than is the case for the embodiment of FIG. 1. As in the other embodiment, the output realized is dependent upon the load connected across the output circuit. This is indicated by the three load lines designated 63, 64 and 65 which are plotted in FIG. 4. These load lines define at the intersections with curve 62, the operating points 62A, 62B and 62C.

Although the smaller junction diode 24E limits the range of output impedances at which essentially constant high voltage outputs can be obtained, the use of a structure of this type in combination with the other diodes is advantageous where it is desired that the solid state transformer be capable of delivering constant currents to a wide range of externally connected load impedances. This is illustrated by the fact that at least three-fourths of that portion of the composite characteristic 62 which extends from point $I_2$ into the third quadrant is extremely flat. This constant current characteristic is produced by the high reverse bias impedance of diode 24E. Therefore, over this range of operating points, which is determined by the input impedance of the load circuit being driven by the transformer, an essentially constant current is supplied.

The above type of combination in which one of the diodes responds differently for a given input voltage applied at the input junction can be realized using structures other than that shown in FIG. 3. It is also possible to arrange the geometry of the device in such a way that the recombination radiation which is incident on one of the diodes for a given input voltage is less than that which is incident upon the other diodes. It is also possible to achieve the same type of result by controlling the doping levels so that the response of one of the output diodes in producing photocurrent for a given applied recombination radiation is less than that of the other diodes.

Figure 5:
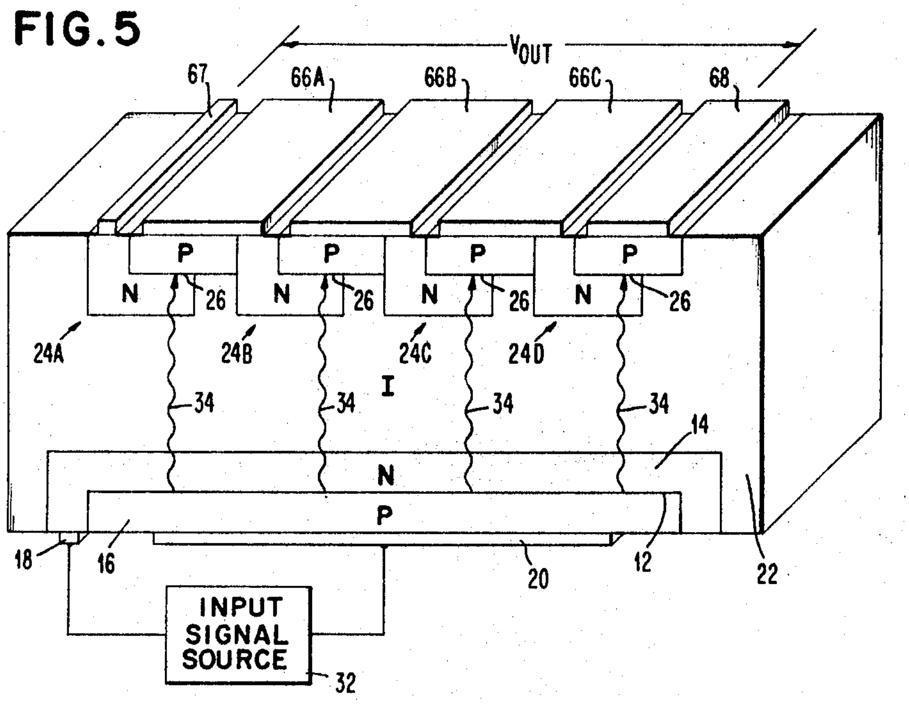
FIG. 5 illustrates another embodiment of the invention showing how the output devices may be fabricated using planar technology.

The embodiment shown in FIG. 5 is electrically the same as that shown in FIG. 1. In this figure the same reference characteristics are employed as are used in FIG. 1, and it can be seen that the four output diodes 24A through 24D are formed at the upper surface of the semiconductor body. As fabricated, the p-region of each device abuts the n-region of the adjacent device and produces an unwanted junction. However electrodes which provide the necessary connections between the p-regions of one diode and the n-region of the next diode in the series circuit, also short out these unwanted junctions. The output is taken across an electrode 67 which makes ohmic contact to the n-region of the first diode 24A and an electrode 68 which provides an ohmic contact to the p-region of the last diode 24D. These electrodes, as is illustrated, extend over almost the entire upper surface of the structure and serve the further function of reflecting back to the output junctions any light transmitted from input junction 12 which passes through the output junctions. It is, of course, apparent that light produced at the input junction 12 propagates not only upwardly toward the output junctions as indicated by arrows 34, but also downwardly toward the bottom of the device. Therefore, for most efficient operation, metallizations can be provided to cover the entire surface of the device with appropriate insulating layers where necessary to thereby confine the recombination radiation to the semiconductor body.

Figure 6:
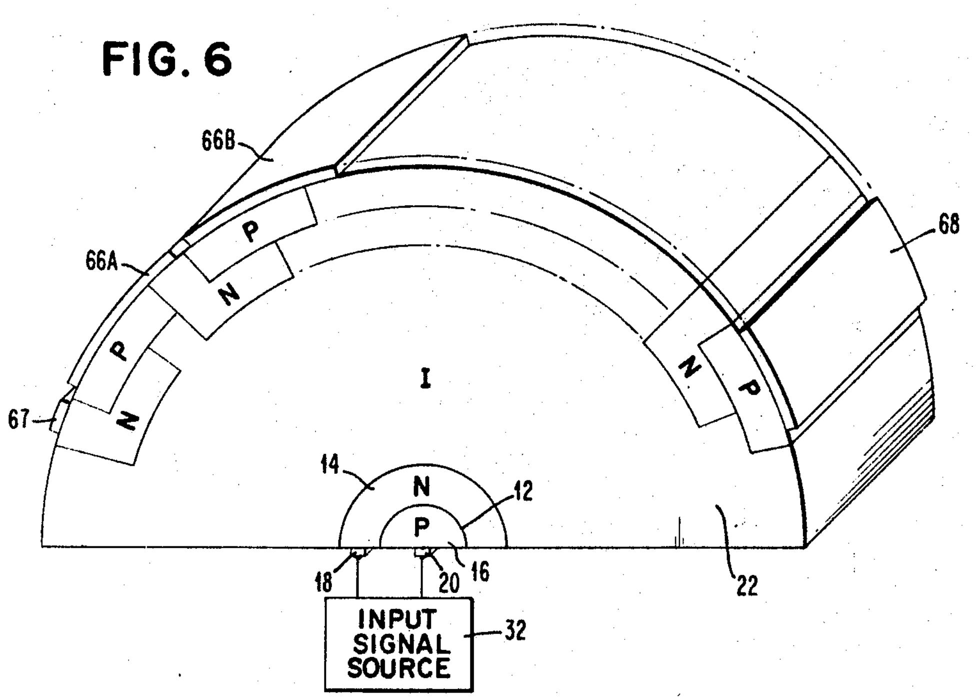
FIG. 6 shows a further embodiment of the invention constructed to realize a circular geometry.

A further embodiment of the invention is shown in FIG. 6, and this embodiment is the same as that shown in FIG. 5 with the exception that a circular geometry is employed. Like reference numerals are again employed to designate functional components. The circular geometry of FIG. 6 is advantageous in providing a symmetrical device in which the light propagates from the input junction essentially the same distance to each of the output junctions. By completing the circle, it is obvious that most of the light produced at the input junction propagates to an appropriate one of the output junctions.

In the discussion above, the solid state transformers were described as being formed of a single semiconductor material. Such a device lends itself to very easy fabrication and the intrinsic region 22 in such device provides electrical isolation between the input and output. It is also possible, and in some cases advantageous, to fabricate devices in accordance with the principles of the invention in which the region 22 is formed of another material. In such a case the other material may be a semiconductor material, such as GaP, which can be combined epitaxially with the GaAs so that a monocrystalline body is provided. The second material is chosen to have a higher band gap and thereby absorbs less of the radiation as it propagates from the input to the output junctions. In some cases it is not necessary that the entire transformer be embodied in one monocrystalline body. Structures in which the insulating region is formed of a material such as an epoxy chosen so that it passes the recombination radiation with very little loss.

Though the embodiments of FIGS. 1, 3, 5 and 6 are limited to a showing of the solid state transformer itself, such transformers can be readily fabricated using the same substrate which carries active semiconductor elements which supply the input signals to the transformers and/or receive output signals from the transformers. This type of fabrication makes it possible to directly transform voltages from a lower to a higher level without leaving the semiconductor substrate. It is also apparent that many more output diodes may be connected in series than the four shown in the illustrative embodiments. Transformer taps can be provided across various combinations of these devices to realize different transformer outputs.

Though in the embodiments thus far discussed GaAs has been employed as a semiconductor material at both junctions and tellurium used as the n-dopant and zinc the p-dopant, it is not necessary that the practice of the invention be restricted to these materials. For example, either the input junction, the output junction, or both can be fabricated using GaAs amphoterically doped with silicon. Devices can be fabricated using an input junction doped with zinc in the p-region to produce recombination radiation, and amphoteric silicon doped GaAs for the output junctions. In such devices the energy gap between the impurity levels at the output junction is somewhat less than that at the input junction. This type of structure can be advantageous in some applications in providing more sufficient absorption of the input radiation though the voltage produced upon absorption is somewhat smaller. Devices can also be fabricated using other semiconductor materials such as indium phosphide, both at the input or emitting junction and at the output or collecting junctions. In such cases semiinsulating GaAs, which can be epitaxially combined with indium phosphide, is employed for the insulating layer separating the input and output junctions.

Amphoterically doped gallium junctions are most efficiently produced using solution regrowth techniques. This technique can also be employed in fabricating junctions wherein zinc and tellurium are employed as dopants. Vapor growth has also been successfully employed in fabricating junctions of the type used in the practice of the subject invention. Techniques of this type, as well as diffusion, can be used in combination with the silicon oxide masking technique commonly used in making integrated circuits to fabricate solid state transformers have different geometries.

Figure 9:
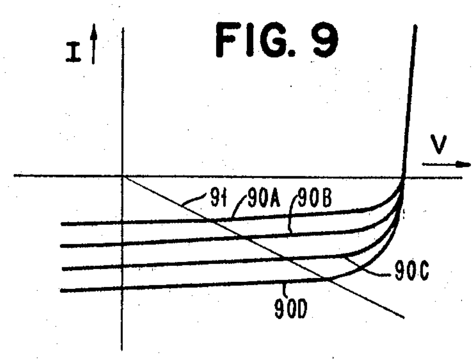
FIG. 9 is a plot depicting a family of operating curves and a load line which illustrate one mode of operating the solid state transformer of the present invention.

In the description of the embodiment of FIGS. 1 and 2 and the charactristics shown in FIGS. 3 and 4 the operation described has been primarily that achieved for a constant value of applied input voltage and, therefore, a constant intensity of recombination radiation applied to the output junctions. In FIG. 9 there is shown a family of curves 90A through 90D which represent the composite characteristics of a group of series connected output diodes for increasing intensities of input recombination radiation. A load line designated 91 is plotted in this figure to illustrate the mode of operation when it is desired to produce a voltage which increases as the input radiation to the output diodes increases. Because of the fact that the input junction 12 has a very low impedance when relatively high forward bias voltages are applied, the larger voltage values depicted along the line 91 in FIG. 9 can be produced by primarily increasing the current through the input junction and requires only relatively small changes in the input voltage.

Figure 7:
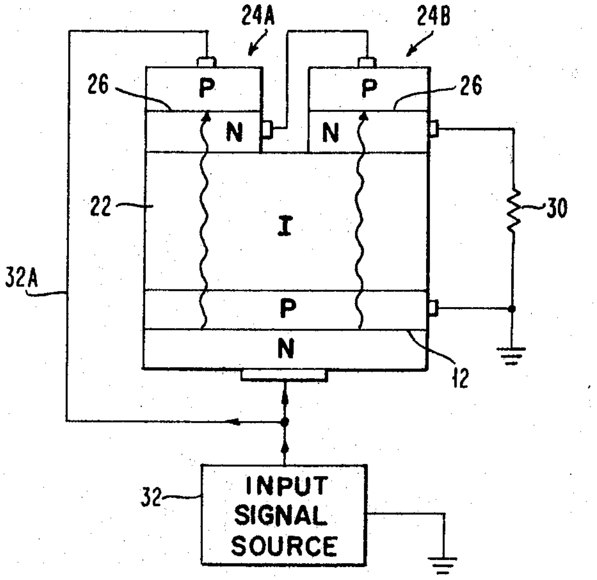
FIG. 7 shows an embodiment of the invention in which an electrical connection is provided between the input and output circuits.

The device shown in FIG. 7 is a further embodiment of the invention. Only two output diodes are shown here to simplify the drawing. The structure differs from the previous embodiments in that the locations of the p- and n-regions which form the input junctions 12 are reversed. Since the input and output diodes are electrically isolated from each other, the p- and n-regions can be rearranged at the input or output to meet circuit or fabrication requirements. The circuit has been further modified by the provision of a connection 32A from the input signal source to the p-region of output diode 24A. Further, the output represented by load 30 is taken between the n-region of diode 24B and the p-region of the input diode 12. With these connections the input voltage is a negative voltage as is the output voltage. Further, because of the connection 32A, the input voltage is actually added to the voltage produced by the transformer action of the solid state device. This type of a device is useful in many applications in which the input voltage of the transformer can be at relatively the same level as the output voltages.

Figure 8:
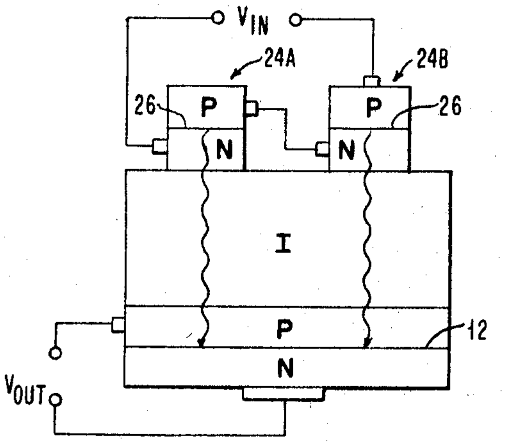
FIG. 8 shows an embodiment of the invention with the connections reversed to produce step down voltage transformation.

In the embodiment of FIG. 8, the structure of the solid state device is essentialy the same as that as has been shown in the previous figures. However, in the device of FIG. 8, the input terminals are connected to the series connected diodes 24A and 24B, and the output terminals are connected across junction 12. This type of connection produces stepdown voltage transformation and step-up current transformation. The number of diodes necessary to step up the current depends upon the overall efficiency. In this device the diodes 26 are operated to produce the recombination radiation and the junction 12 is responsive to this radiation to produce the output.

The junction 12 in the device of FIG. 8 can be considered to be the equivalent of a plurality of parallel connected individual junctions in which the voltage is the same everywhere across the junction and the current is additive. In the embodiments discussed above wherein the junction 12 is employed as an input junction, the same is true, and when the juiction is long, the series resistance of the input circuit can be reduced by making a number of different contacts to the p- and n-regions along the length of the junction or by forming individual junctions and connecting them in parallel.

Figure 10:
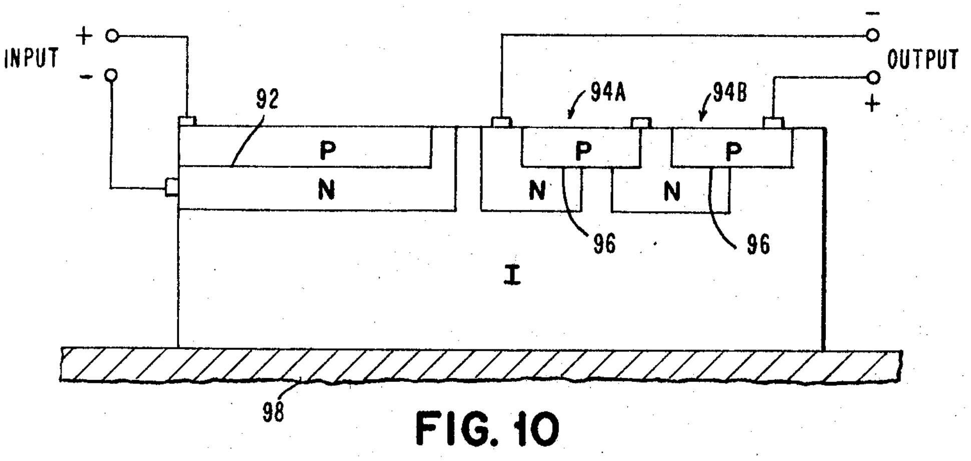
FIG. 10 shows an embodiment of the invention in which the input junction is operated in a laser mode.

The final embodiment shown in FIG. 10 employes an input junction 92 and a pair of series connected output diodes 94A and 94B. The junctions 96 of these two diodes are aligned with the input junction 92 since the input applied is sufficient to produce stimulated emission and a lasing light output at junction 92. This light travels along the junction and it is for this reason that junctions 96 are aligned with junction 92. The entire device is shown mounted on a heat sink 98 to carry away heat generated primarily at the input junction. In such a device, conventional means may be employed to achieve a laser cavity and cause the lasing light to propagate back and forth between the end surfaces of the device.

While the invention has been particularly shown and described with reference to preferred embodiments thereof it will be understood by those skilled in the art that various changes in form and details may be made therein without departing from the spirit and scope of the invention.

What is claimed is:

1. A solid state transformer comprising:

(a) a single first recombination radiation input junction between regions of different conductivity type in a body of semiconductor material;

(b) input means for said transformer for applying a forward bias voltage to said body across said first junction to cause carriers to be injected at said first junction which recombine to produce electromagnetic recombination radiation;

(c) said recombination radiation having a frequency determined by the energy levels at said first junction between which the injected carriers undergo radiative transitions;

(d) a plurality of unbiased individual output junctions each between regions of different industrial type in a body of semiconductor material arranged to receive the recombination radiation produced at said single input junction;

(e) each of said output junctions in an unbiased condition being responsive to said radiation to produce a photovoltage and current at the output junction;

(f) and means connecting said output junctions in a series circuit for developing an output voltage from said transformer, there being a sufficient number of said output junctions in said series circuit that said output voltage has a greater amplitude than the voltage applied by said input means.

2. The solid state transformer of claim 1 wherein said input junction and said plurality of output junctions are integrated in a single monocrystalline body.

3. The solid state transformer of claim 2 wherein said body is formed of one semiconductor material.

4. The solid state transformer of claim 3 wherein said input junction is isolated from said plurality of output junctions by a region of said monocrystalline body which is semiinsulating.

5. The solid state transformer of claim 1 wherein each of said output junctions individually responds to produce essentially the same photovoltage and current when an input signal is applied to said input means by said transformer and causes recombination radiation to be applied to each of said output junctions.

6. The solid state transformer of claim 1 wherein at least a first one of said output junctions has a lower saturation photocurrent than the others of said output junctions and the current in the series circuit formed by said junctions connected in series is limited by said lower photocurrent of said one output junction.

7. The solid state transformer of claim 6 wherein said first junction has a smaller area than the others of said junctions.

8. The solid state transformer of claim 1 wherein said input signal applied to said input junction is sufficient to bias said junction means above the threshold necessary to produce stimulated emission at said first junction means.

9. The solid state transformer of claim 1 wherein said input junction means and each of said output junctions is a GaAs junction;

said input junction means including a p-region in which the GaAs is doped with zinc;

and said output junctions include a p-region amphoterically doped with silicon.

10. The solid state transformer of claim 1 wherein said transformer input means applies a D.C. voltage directly across said first junction;

and said series connected output junctions produce a transformed D.C. voltage in response to the radiation produced by the application of said D.C. voltage across said first junction.

11. A voltage transformer comprising:

(a) an electro-optic recombination radiation means;

(b) a transformer input connected to said recombination radiation means for applying an electrical input thereto and producing a light output therefrom;

(c) a plurality of unbiased individual radiation response output devices each arranged to intercept the radiation produced at said recombination radiation means and responsive to said radiation for producing an electrical voltage output;

(d) and means connecting said individual output devices in series for providing across said series connected devices an output voltage, there being a sufficient number of said output devices that said output voltage is higher than the said voltage input applied at the input of the transformer.

12. The transformer of claim 11 wherein said recombination radiation input means and said plurality of output devices are integrated in a single body of material.

13. The transformer of claim 12 wherein said recombination radiation means comprises at least one p-n junction formed in a body of semiconductor material and, each said radiation responsive output device comprising a p-n junction formed in a body of the same semiconductor material.

14. The transformer of claim 13 wherein the area of the p-n junctions of at least one of said radiation responsive devices is different than the area of the junction of others of said radiation responsive output devices.

15. A semiconductor radiation coupled transformer device comprising:

(a) a plurality of individual semiconductor junctions each located between regions of different conductivity type in a body of semiconductor material;

(b) means connecting said individual semiconductor junctions in series;

(c) a first pair of terminals for said transformer connected across said series connected junctions;

(d) a further junction means located between regions of different conductivity type in a body of semiconductor material;

(e) a second pair of terminals for said transformer connected in parallel across said entire further junction means;

(f) means for applying a voltage to be transformed across one of said pairs of terminals to produce recombination radiation;

(g) said junctions being arranged for coupling of radiation between said individual series connected junctions and said further junction means;

(h) output load means connected across the other of said pair of terminals;

(i) the number of junctions in said plurality of junctions connected in series being sufficient that the voltage across said first pair of terminals is greater than the voltage across said second pair of terminals.

16. The transformer of claim 15 wherein said input means is connected to said first pair of terminals and said output means is connected to said second pair of terminals.

17. The transformer of claim 16 wherein said input means is connected to said second pair of terminals and said output means is connected to said first pair of terminals.

18. The transformer of claim 15 wherein said further junction means is a single continuous junction.

References Cited

UNITED STATES PATENTS

| | | | |
|---|---|---|---|
| 2,000,642 | 5/1935 | Lamb | 317—235 |
| 2,919,299 | 12/1959 | Paradise | 317—235 |
| 3,229,104 | 1/1966 | Rutz | 317—235 |
| 3,315,176 | 4/1967 | Biard | 317—235 |
| 3,358,146 | 12/1967 | Ing et al. | 317—235 |

JOHN W. HUCKERT, *Primary Examiner.*

JERRY D. CRAIG, *Assistant Examiner.*

U.S. Cl. X.R.

250—211; 307—311; 317—234